(12) United States Patent
Uchida et al.

(10) Patent No.: US 8,705,236 B2
(45) Date of Patent: Apr. 22, 2014

(54) LOOP HEAT PIPE AND ELECTRONIC APPARATUS

(75) Inventors: Hiroki Uchida, Isehara (JP); Susumu Ogata, Isehara (JP); Seiji Hibino, Isehara (JP); Jun Taniguchi, Isehara (JP)

(73) Assignee: Fujitsu Limited, Kawasaki (JP)

( * ) Notice: Subject to any disclaimer, the term of this patent is extended or adjusted under 35 U.S.C. 154(b) by 113 days.

(21) Appl. No.: 13/527,920

(22) Filed: Jun. 20, 2012

(65) Prior Publication Data

US 2013/0083482 A1 Apr. 4, 2013

(30) Foreign Application Priority Data

Sep. 29, 2011 (JP) ................................. 2011-214168

(51) Int. Cl.
*H05K 7/20* (2006.01)
*F28D 15/00* (2006.01)

(52) U.S. Cl.
USPC .................. 361/700; 165/104.26; 165/104.33

(58) Field of Classification Search
None
See application file for complete search history.

(56) References Cited

U.S. PATENT DOCUMENTS

| 6,058,711 | A | * | 5/2000 | Maciaszek et al. | ............... 62/3.2 |
| 8,047,268 | B1 | * | 11/2011 | Kroliczek et al. | ....... 165/104.26 |
| 8,100,170 | B2 | * | 1/2012 | Huang et al. | ............. 165/104.26 |
| 2005/0051304 | A1 | | 3/2005 | Makino | |
| 2010/0188818 | A1 | * | 7/2010 | Li | ................................. 361/700 |

FOREIGN PATENT DOCUMENTS

| JP | 2004-190976 A1 | 7/2004 |
| JP | 2009-115396 A1 | 5/2009 |
| JP | 2011-27321 A1 | 2/2011 |

\* cited by examiner

*Primary Examiner* — Gregory Thompson
(74) *Attorney, Agent, or Firm* — Kratz, Quintos & Hanson, LLP

(57) ABSTRACT

A loop heat pipe includes: an evaporator to convert liquid phase working fluid into vapor phase working fluid; a condenser to convert vapor phase working fluid into liquid phase working fluid; a first vapor line and a first liquid line to allow the evaporator to communicate with the condenser and form a circular main loop; and a second vapor line and a second liquid line to allow the evaporator to communicate with the condenser and form a circular auxiliary loop; wherein the evaporator includes a reservoir that temporarily stores the liquid phase working fluid, a first vapor collector that communicates with the first vapor line, a second vapor collector that communicates with the second vapor line, first wick disposed between the reservoir and the first vapor collector, and second wick disposed between the reservoir and the second vapor collector.

10 Claims, 8 Drawing Sheets

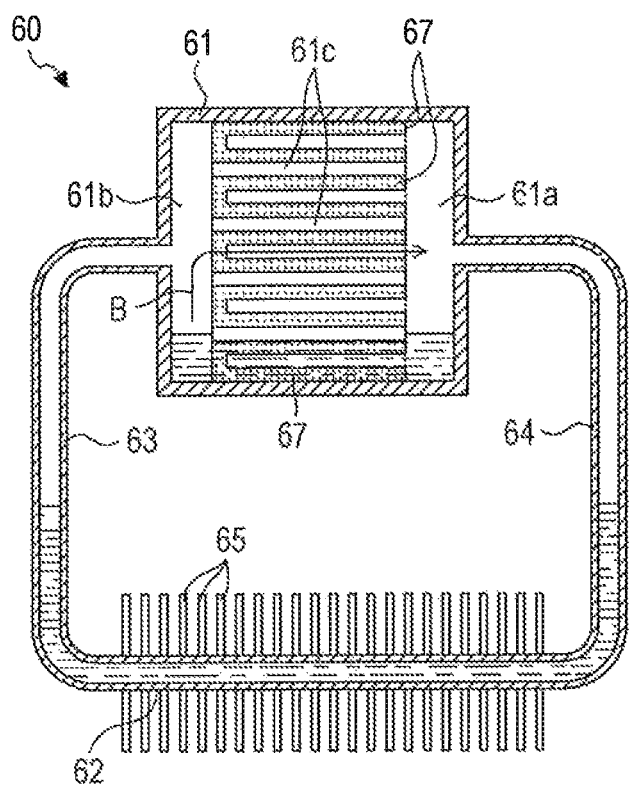

LOOP HEAT PIPE AND ELECTRONIC APPARATUS

CROSS-REFERENCE TO RELATED APPLICATION

This application is based upon and claims the benefit of priority of the prior Japanese Patent Application No.2011-214168, filed on Sep. 29, 2011, the entire contents of which are incorporated herein by reference.

FIELD

The embodiments discussed herein are related to a loop heat pipe and an electronic apparatus including the loop heat pipe.

BACKGROUND

A loop heat pipe is a heat transfer device that uses a change of phase of working fluid. For example, loop heat pipes are used to cool a central processing unit (CPU) or an electronic component other than a CPU. A loop heat pipe includes an evaporator, a condenser, and a vapor line and a fluid line that allow the evaporator to communicate with the condenser and form a circular flow passage. The loop heat pipe contains working fluid, such as water or ethanol.

Japanese Laid-open Patent Publication Nos. 2004-190976, 2011-027321, and 2009-115396 are examples of related art.

SUMMARY

According to an aspect of the embodiments, a loop heat pipe includes: an evaporator to convert liquid phase working fluid into vapor phase working fluid; a condenser to convert vapor phase working fluid into liquid phase working fluid; a first vapor pipe and a first liquid pipe to allow the evaporator to communicate with the condenser and form a circular main loop; and a second vapor pipe and a second liquid pipe to allow the evaporator to communicate with the condenser and form a circular auxiliary loop; wherein the evaporator includes a reservoir that temporarily stores the liquid phase working fluid flowing from the first liquid pipe and the second liquid pipe, a first vapor collector that communicates with the first vapor pipe, a second vapor collector that is closer to the condenser than to the first vapor collector and that communicates with the second vapor pipe, a partition wall that separates the first vapor collector from the second vapor collector, at least one first wick formed from a porous member and disposed between the reservoir and the first vapor collector, and at least one second wick formed from a porous member and disposed between the reservoir and the second vapor collector.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a cross-sectional view illustrating a problem of the loop heat pipe illustrated in FIGS. 1A and 1B;

DESCRIPTION OF EMBODIMENTS

To facilitate an understanding of a present embodiment, a brief background is provided below before the exemplary embodiments are described.

Figure 1A:
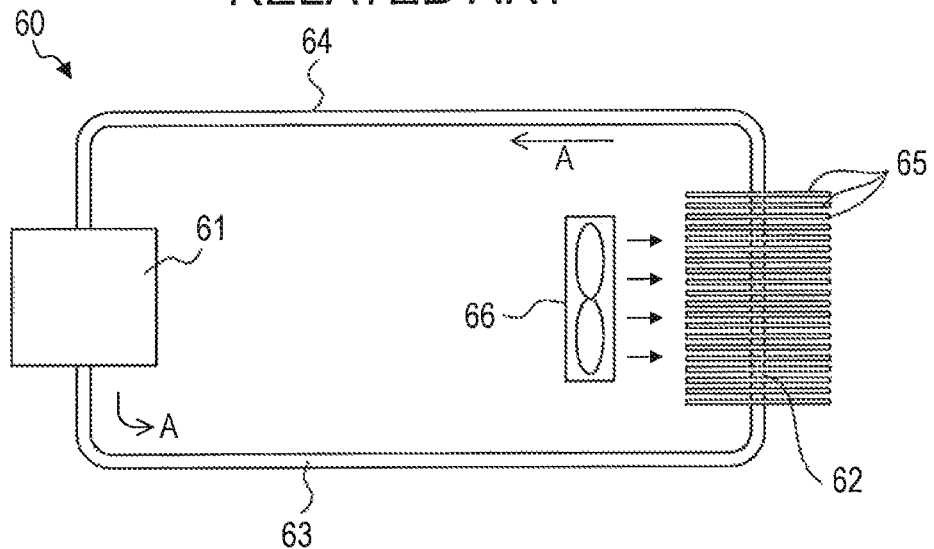
FIG. 1A is a schematic illustration of an example of a loop heat pipe.
Figure 1B:
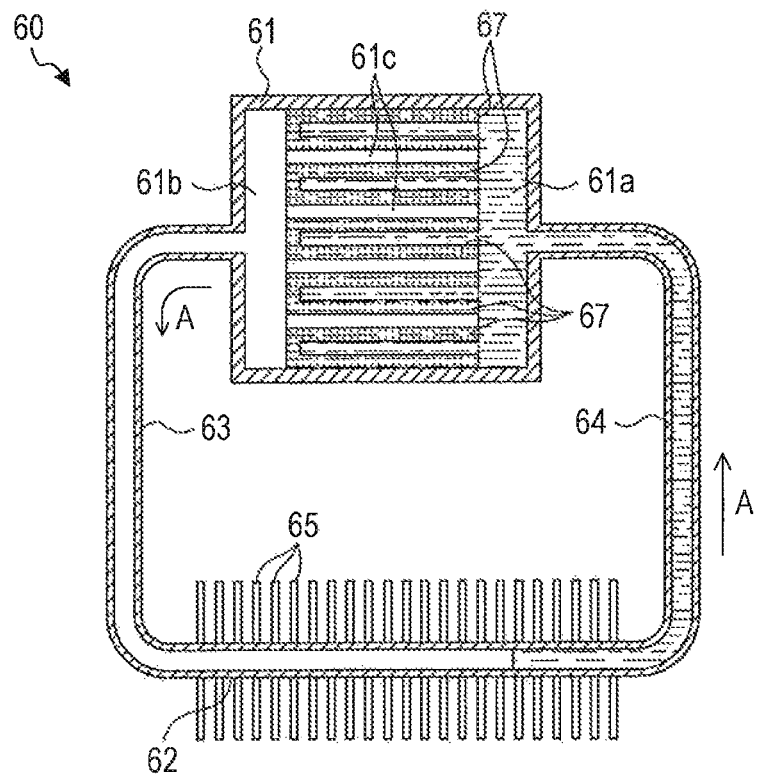
FIG. 1B is a cross-sectional view of the loop heat pipe.

FIG. 1A is a schematic illustration of an example of a loop heat pipe. FIG. 1B is a cross-sectional view of the loop heat pipe.

As illustrated in FIG. 1A, a loop heat pipe 60 includes an evaporator 61, a condenser 62, and a vapor line (pipe) 63 and a fluid line (pipe) 64 that allow the evaporator 61 to communicate with the condenser 62 and form a circular flow passage. The loop heat pipe 60 has working fluid, such as water or ethanol, enclosed therein.

The evaporator 61 is in thermal contact with an electronic component, such as a CPU. Accordingly, heat generated by the electronic component is transferred to the evaporator 61 and, therefore, the temperature of the evaporator 61 increases. In contrast, the condenser 62 has a fin 65 attached thereto. Cooling air is supplied to the fin 65 by a blower fan 66 disposed in the vicinity of the condenser 62.

As illustrated in FIG. 1B, the evaporator 61 is partitioned into three spaces: a liquid reservoir 61a located so as to be adjacent to the fluid line 64, a vapor collecting chamber 61b located so as to be adjacent to the vapor line 63, and a wick arranging chamber located between the liquid reservoir 61a and the vapor collecting chamber 61b. The liquid reservoir 61a tentatively reserves liquid phase working fluid moved from the fluid line 64.

The wick arranging chamber has heat transfer blocks 61c arranged therein. Each of the heat transfer blocks 61c has a plurality of holes each having a wick 67 inserted therein. The wick 67 is formed from a porous member. The wick 67 has a cylindrical shape having one end that is closed. The wicks 67 are arranged so that the closed ends are oriented toward the vapor collecting chamber 61b and the open ends are oriented toward the liquid reservoir 61a. In addition, the outer peripheral surface of each of the wicks 67 has a plurality of grooves (vapor discharge grooves) that extend in the central axis direction thereof and communicate with the vapor collecting chamber 61b.

Since the wick 67 is formed from a porous member, the liquid phase working fluid in the liquid reservoir 61a soaks into the wick 67 and moves to the outer peripheral portion of the wick 67 due to capillary force. Thereafter, in the outer peripheral portion of the wicks 67, the liquid phase working fluid is heated by the heat transferred from an electronic component via the heat transfer blocks 61c. Thus, the liquid phase working fluid changes into a vapor phase (vapor).

When the working fluid changes from a liquid phase into a vapor phase, the volume of the working fluid increases. At that time, the pores of the wick 67 are filled with the liquid phase working fluid. Accordingly, it is difficult for the working fluid changed into a vapor phase (the vapor) in the outer peripheral portion of the wick 67 to enter inside of the wick 67. Thus, the vapor phase working fluid moves from the vapor collecting chamber 61b to the condenser 62 via the vapor line 63.

The vapor phase working fluid moved to the condenser 62 is cooled by cold air supplied by the blower fan 66 and is changed into the liquid phase. Subsequently, the liquid phase working fluid is pushed out of the condenser 62 by the vapor moving from the evaporator 61. The liquid phase working fluid passes through the fluid line 64 and moves into the liquid reservoir 61a in the evaporator 61.

In this way, the working fluid circulates in the loop heat pipe 60 while being changed from the vapor phase into the liquid phase and vice versa. Thus, heat is transferred from the evaporator 61 to the condenser 62, and the electronic component connected to the evaporator 61 is cooled. An arrow "A" illustrated in FIGS. 1A and 1B indicates the direction in which the working fluid moves. The loop heat pipe 60 starts operating when the temperature of the evaporator 61 becomes higher than or equal to a predetermined temperature due to the heat transferred from the electronic component and stops the operation when the temperature of the evaporator 61 becomes lower than the predetermined temperature.

A problem associated with the loop heat pipe 60 is described below. If the loop heat pipe 60 is horizontally disposed or is disposed so that the evaporator 61 is located beneath the condenser 62 (in a bottom heat mode), the liquid phase working fluid remains in the liquid reservoir 61a of the evaporator 61 after the loop heat pipe 60 stops the operation. The remaining liquid phase working fluid enters the pores of each of the wicks 67 due to capillary force. Thus, the pores of the wicks 67 are filled with the liquid phase working fluid. Accordingly, if the temperature of the evaporator 61 becomes higher than or equal to the predetermined temperature, the loop heat pipe 60 normally starts operating.

However, if the loop heat pipe 60 is disposed so that the evaporator 61 is above the condenser 62 (in a top heat mode), all the liquid phase working fluid is moved into the lower section of the evaporator 61 due to a force of gravity when the loop heat pipe 60 stops operating, as illustrated in FIG. 2. Accordingly, in the wick 67 disposed in the upper section of the evaporator 61, the liquid phase working fluid is lost. Thus, the wick 67 is dried.

At that time, if heat is transferred from the electronic component to the evaporator 61, vapor phase working fluid is generated in the outer peripheral portion of the wick 67. However, as indicated by an arrow B illustrated in FIG. 2, the vapor phase working fluid flows back toward the liquid reservoir 61a via the pores of the wicks 67 disposed in the upper section of the evaporator 61.

Therefore, a drive force to push the working fluid from the evaporator 61 to the condenser 62 is not generated and, thus, the loop heat pipe 60 is unable to start operating. As a result, the electronic component connected to the evaporator 61 is not cooled, causing a false operation or malfunction of the electronic component.

A loop heat pipe capable of reliably starting its operation regardless of the position of the loop heat pipe and an electronic apparatus using the loop heat pipe according to an exemplary embodiment is described below.

Exemplary Embodiments

Figure 3:
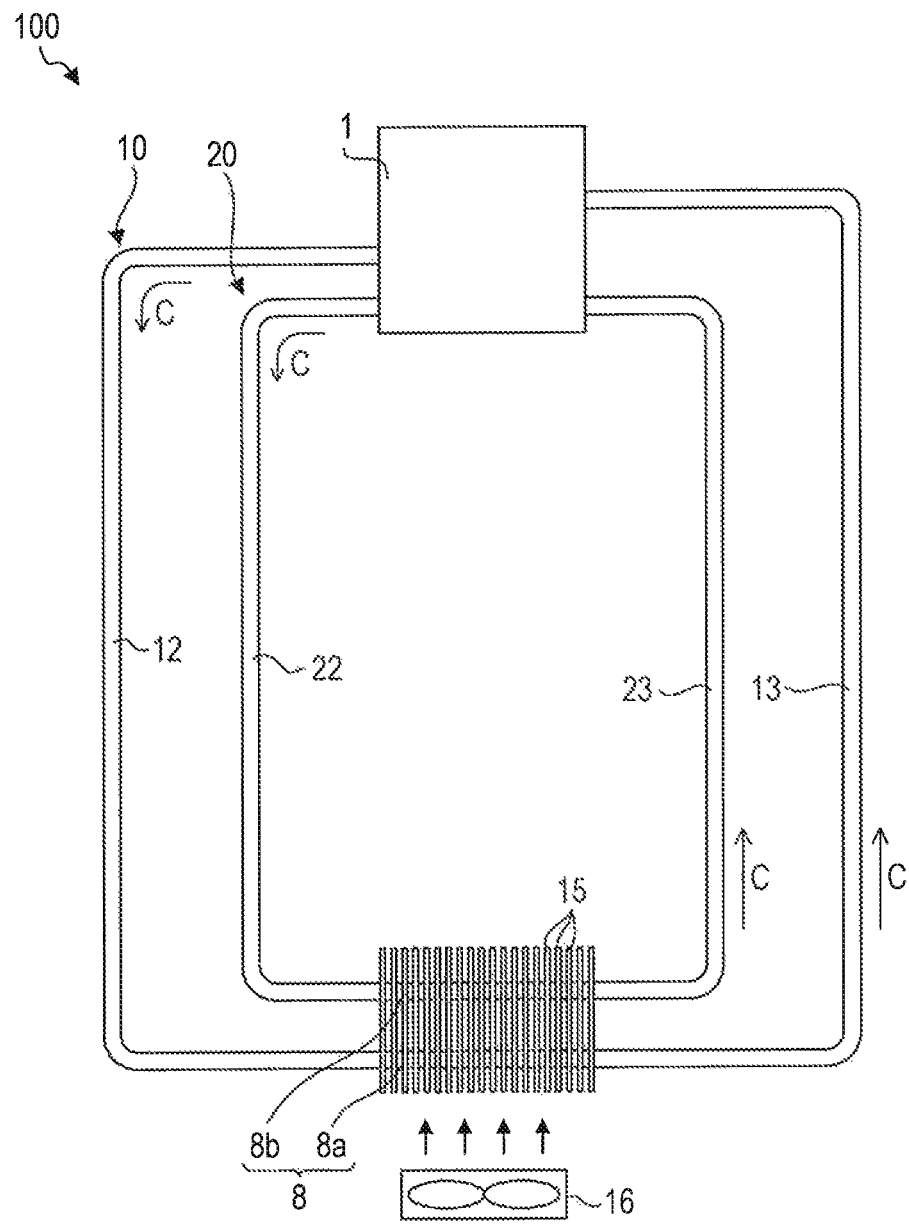
FIG. 3 is a plan view of a loop heat pipe according to an exemplary embodiment.

FIG. 3 is a plan view of the loop heat pipe according to a present exemplary embodiment. In FIG. 3, an arrow C indicates a direction in which the working fluid moves.

According to the present exemplary embodiment, a loop heat pipe 100 includes an evaporator 1, a condenser 8, a first vapor line (pipe) 12, and a second vapor line (pipe) 22, a first liquid line (pipe) 13, and a second liquid line (pipe) 23. The loop heat pipe 100 has ethanol enclosed therein. The ethanol serves as working fluid. Note that water, acetone, butane, ammonia, pentane, or R141B may be used instead of ethanol.

The evaporator 1 has a flat plate shape. The evaporator 1 is thermally connected to an electronic component, such as a CPU. One end surface of the evaporator 1 (the left side surface in FIG. 3) includes a first outlet portion and a second outlet portion through which the vapor phase working fluid is discharged. The other end surface (the right side surface in FIG. 3) includes a first inlet portion and a second inlet portion through which the liquid phase working fluid enters the evaporator 1. The first vapor line 12 is connected to the first outlet portion. The second vapor line 22 is connected to the second outlet portion. The first liquid line 13 is connected to the first inlet portion. The second liquid line 23 is connected to the second inlet portion.

The condenser 8 includes a first condenser line 8a that allows the first vapor line 12 to communicate with the first liquid line 13 and a second condenser line 8b that allows the second vapor line 22 to communicate with the second liquid line 23. In addition, the first condenser line 8a and the second condenser line 8b have a fin 15 attached thereto. The fin 15 dissipates heat. Cold air is supplied from a blower fan 16 to the fin 15 and, therefore, the working fluid flowing through the first condenser line 8a and the second condenser line 8b is cooled. According to the present exemplary embodiment, as illustrated in FIG. 3, the blower fan 16 is disposed on the opposite side of the first condenser line 8a from the second condenser line 8b.

While the present exemplary embodiment has been described with reference to the fin 15 and the blower fan 16 that cool the condenser 8, the condenser 8 may be cooled by dipping the condenser 8 in liquid having a temperature lower than or equal to room temperature.

The evaporator 1, the first vapor line 12, the condenser 8 (the first condenser line 8a), and the first liquid line 13 form a main loop 10 through which the working fluid circulates. In addition, the evaporator 1, the second vapor line 22, the condenser 8 (the second condenser line 8b), and the second liquid line 23 form an auxiliary loop 20 through which the working fluid circulates. As illustrated in FIG. 3, the auxiliary loop 20 is disposed inside the main loop 10.

Figure 4A:
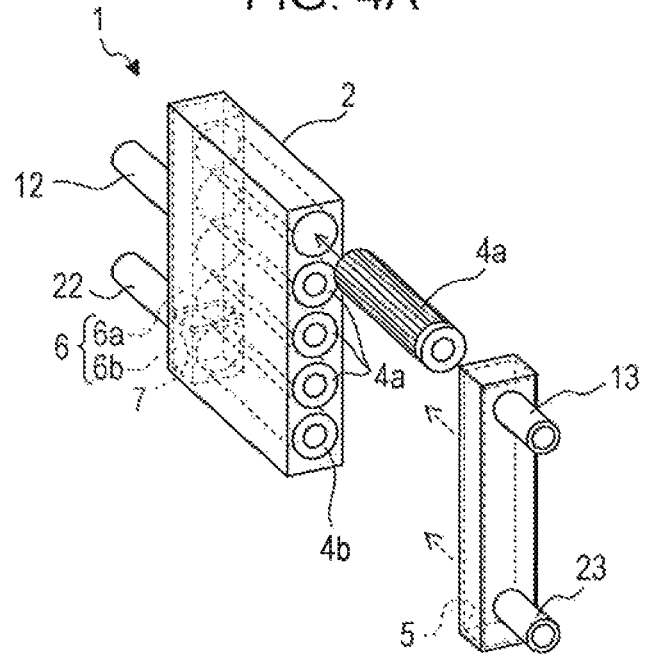
FIG. 4A is an exploded perspective view of an evaporator of the loop heat pipe illustrated in FIG. 3.
Figure 4B:
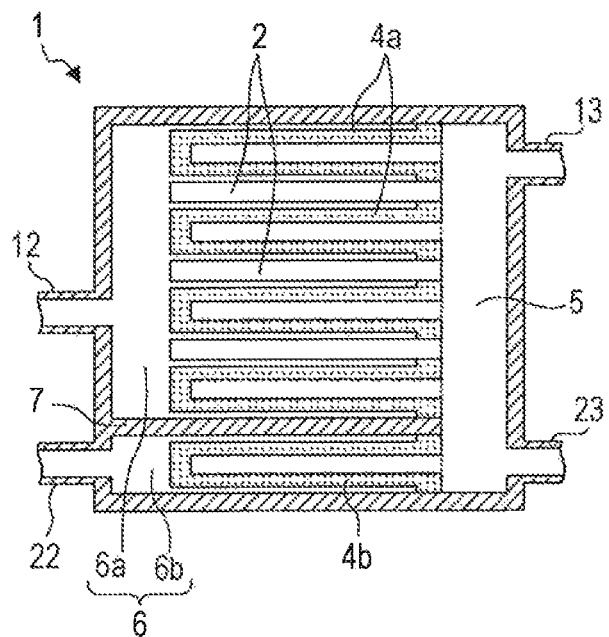
FIG. 4B is a cross-sectional view of the evaporator illustrated in FIG. 4A.

FIG. 4A is an exploded perspective view of the evaporator 1 of the loop heat pipe 100 illustrated in FIG. 3. FIG. 4B is a cross-sectional view of the evaporator 1 of the loop heat pipe 100 cut by a plane parallel to a connecting surface of an electronic component.

As illustrated in FIG. 4B, the evaporator 1 includes a heat transfer block 2, a plurality of first wicks 4a, and a second wick 4b. The heat transfer block 2 has through-holes formed therein and arranged in a line. The wicks 4a and the wick 4b are inserted into the through-holes and disposed in the through-holes. Each of the wicks 4a and the wick 4b is formed from a porous member. Each of the wicks 4a and the wick 4b has a cylindrical shape having one end that is closed.

The wicks 4a and the wick 4b are disposed so that the closed ends are oriented toward the first vapor line 12 and the second vapor line 22 and the open ends are oriented toward the first liquid line 13 and the second liquid line 23. In addition, the outer peripheral surface of each of the wicks 4a and the wick 4b has a plurality of grooves that extend in the central axis direction of wicks 4a and the wick 4b.

Note that according to the present exemplary embodiment, for simplicity, among the plurality of wicks disposed in the evaporator 1, one of the wicks that is the closest to the condenser 8 is referred to as a "second wick 4b", and the other wicks are referred to as "first wicks 4a". According to the present exemplary embodiment, the first wicks 4a and the second wick 4b are similar to one another. However, for example, the first wick 4a may differ from the second wick 4b in size or shape.

The heat transfer block 2 is made of a metal having an excellent heat conductivity, such as copper or aluminum. The heat transfer block 2 is thermally connected to an electronic component, such as a CPU. As illustrated in FIG. 4B, a vapor collector 6 that collects the vapor phase working fluid generated in the outer peripheral portions of the wicks 4a and 4b is disposed on one side of the heat transfer block 2. A liquid reservoir 5 that temporarily stores the liquid phase working fluid moved from the first liquid line 13 and the second liquid line 23 is disposed on the other side.

The vapor collector 6 includes a partition wall 7. The vapor collector 6 is partitioned into a first vapor collecting portion 6a and a second vapor collecting portion 6b by the partition wall 7. The first vapor collecting portion 6a communicates with the first vapor line 12. The vapor phase working fluid generated in the first wicks 4a is collected into the first vapor collecting portion 6a. The first vapor collecting portion 6a and the first wicks 4a form part of the main loop 10.

The second vapor collecting portion 6b communicates with the second vapor line 22. The vapor phase working fluid generated in the second wick 4b is collected into the second vapor collecting portion 6b. The second vapor collecting portion 6b and the second wick 4b form part of the auxiliary loop 20.

The liquid reservoir 5 does not have a partition wall. The first liquid line 13 is connected to the portion of the liquid reservoir 5 corresponding to the first vapor collecting portion 6a. The second liquid line 23 is connected to the portion of the liquid reservoir 5 corresponding to the second vapor collecting portion 6b.

While the present exemplary embodiment has been described with reference to the auxiliary loop 20 having a single wick (i.e., the second wick 4b), two or more wicks may be disposed in the auxiliary loop 20. However, it is desirable that the number of wicks in the auxiliary loop 20 be minimized, since the loop heat pipe 100 may be easily started when the position of the loop heat pipe 100 is in a top heat mode. In addition, while the present exemplary embodiment has been described with reference to the main loop 10 having four wicks (the first wicks 4a), any number of wicks may be disposed in the main loop 10.

The operation performed by the loop heat pipe 100 having the above-described structure in a top head mode is described below with reference to the schematic cross-sectional views in FIGS. 5A and 5B and FIGS. 6A and 6B. As illustrated in FIGS. 5A and 5B and FIGS. 6A and 6B, if the loop heat pipe 100 is placed in a top heat mode, the second wick 4b is located beneath the first wicks 4a.

Figure 5A:
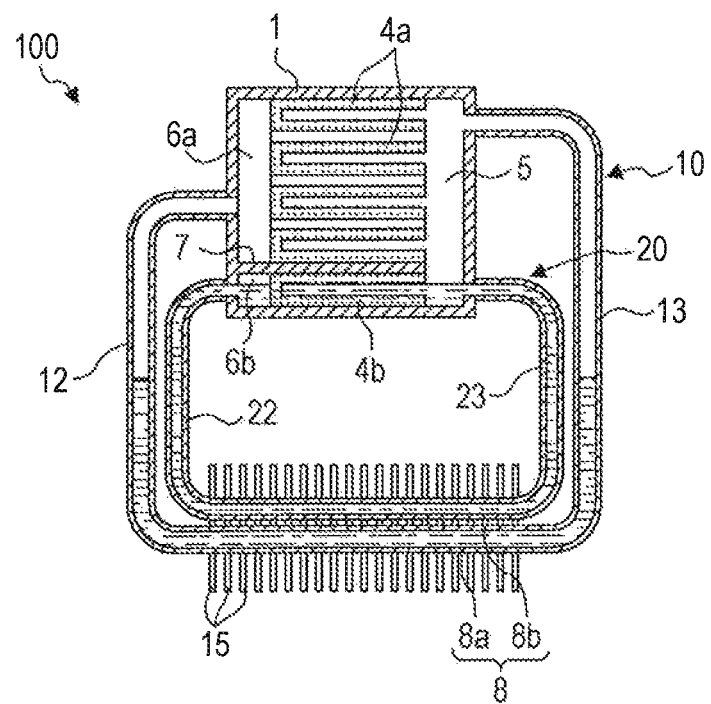
FIGS. 5A and 5B are schematic illustrations (first schematic illustrations) of an operation performed by the loop heat pipe according to the exemplary embodiment when the loop heat pipe is disposed in a top heat mode.

FIG. 5A illustrates the loop heat pipe 100 that is not operating. As illustrated in FIG. 5A, if the operation performed by the loop heat pipe 100 is stopped, the liquid phase working fluid moves downward due to a force of gravity and is accumulated in the first vapor line 12, the second vapor line 22, the first liquid line 13, the second liquid line 23, and the condenser 8. In such a case, most part of the liquid phase working fluid staying in the liquid reservoir 5 enters the second liquid line 23 connected to the lower section of the evaporator 1. Accordingly, a relatively large amount of the working fluid is accumulated in the auxiliary loop 20.

In addition, a small amount of the liquid phase working fluid remains in the lower section of the evaporator 1. Accordingly, the liquid phase working fluid soaks into the wick 4b disposed in the lower section of the evaporator 1 due to capillarity. Thus, the pores of the wick 4b are filled with the liquid phase working fluid.

In contrast, the wicks 4a disposed in the upper section of the evaporator 1 are dried, since the liquid phase working fluid soaked in the wicks 4a is moved downward due to a force of gravity.

Figure 5B:
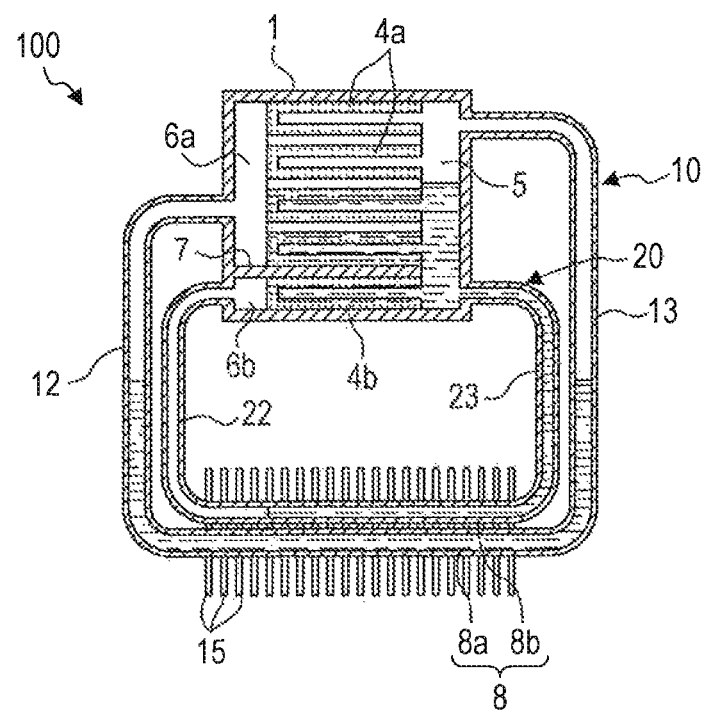

When heat is transferred from an electronic component to the evaporator 1 and if the temperature of the evaporator 1 reaches or exceeds a predetermined temperature, vapor (the vapor phase working fluid) is generated in the outer peripheral portion of the wick 4b disposed in the lower section of the evaporator 1. As illustrated in FIG. 5B, the vapor pushes the liquid phase working fluid in the second vapor collecting portion 6b and the second vapor line 22 toward the second liquid line 23. As a result, the liquid phase working fluid flows from the second liquid line 23 into the liquid reservoir 5 in the evaporator 1. Thereafter, the liquid level of the working fluid in the liquid reservoir 5 rises and, therefore, the liquid phase working fluid soaks into the wicks 4a.

However, before the liquid phase working fluid sufficiently soaks into all of the wicks 4a, even when the vapor phase working fluid is generated in the outer peripheral portions of the lower wicks 4a, the vapor phase working fluid passes through the first vapor collecting portion 6a and the upper wicks 4a and flows back to the liquid reservoir 5. Accordingly, circulation of the working fluid does not start in the main loop 10.

Figure 6A:
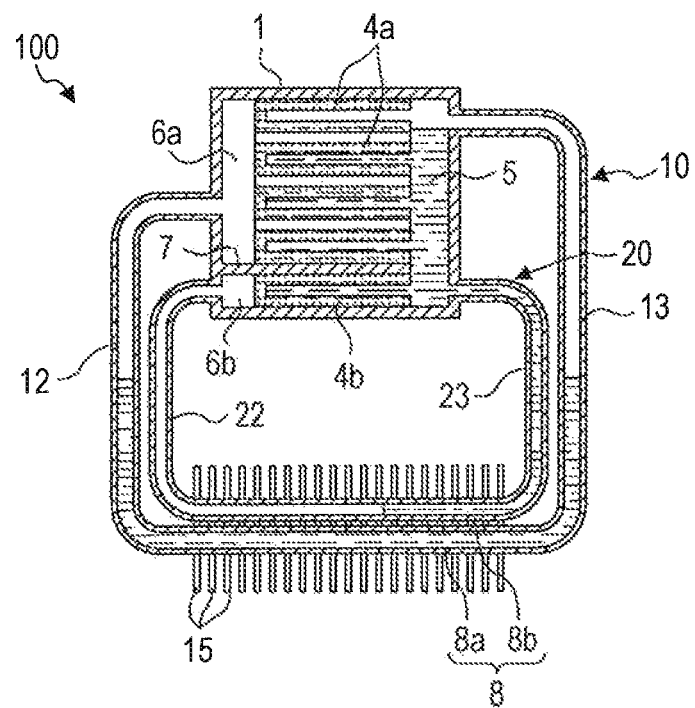
FIGS. 6A and 6B are schematic illustrations (second schematic illustrations) of an operation performed by the loop heat pipe according to the exemplary embodiment when the loop heat pipe is disposed in a top heat mode.
Figure 6B:
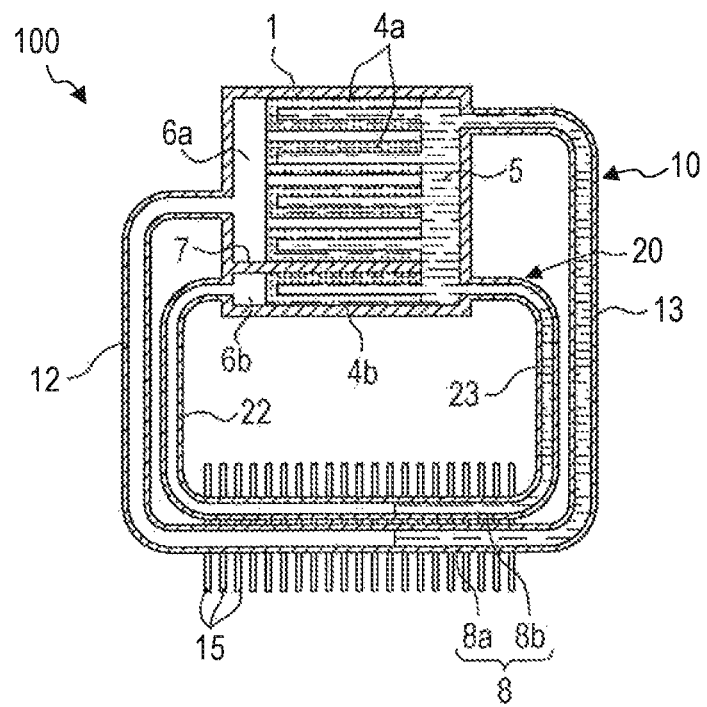

Subsequently, after a certain amount of time passes, the liquid phase working fluid in the auxiliary loop 20 is further pushed out into the liquid reservoir 5, as illustrated in FIG. 6A. Thus, the liquid level of the working fluid in the liquid reservoir 5 rises and, therefore, the liquid phase working fluid soaks into all of the wicks 4a. In this way, the vapor phase working fluid generated in the wicks 4a flows into the first vapor line 12, and the liquid phase working fluid staying in the first vapor line 12 is pushed out of the first vapor line 12 toward the first liquid line 13. As a result, as illustrated in FIG. 6B, the liquid reservoir 5 is filled with the liquid phase working fluid and, therefore, stable circulation of the working fluid starts in the main loop 10.

After stable circulation of the working fluid starts in the main loop 10, a large amount of heat may be transferred from the evaporator 1 to the condenser 8. Accordingly, the electronic component connected to the evaporator 1 may be sufficiently cooled.

As described above, according to the present exemplary embodiment, since the loop heat pipe 100 has the main loop 10 and the auxiliary loop 20, the loop heat pipe 100 that is disposed in a top heat mode reliably starts operating if the temperature of the evaporator 1 reaches or exceeds the predetermined temperature.

In addition, in the loop heat pipe 60 illustrated in FIG. 1, a bubble may enter the wicks 67 for some reason. At that time, the vapor flows back from the vapor collecting chamber 61b to the liquid reservoir 61a and, therefore, the drive force to circulate the working fluid may be significantly decreased (i.e., dryout may occur). In contrast, in the loop heat pipe 100 according to the present exemplary embodiment, even when a bubble enters the wicks 4a and, therefore, the drive force is decreased in the main loop 10, the working fluid continuously circulates due to the presence of the auxiliary loop 20. Accordingly, the pressure of the working fluid flowing from the second liquid line 23 is applied to the liquid phase working fluid in the liquid reservoir 5, and the bubble in the wicks 4a is pushed out towards the first vapor collecting portion 6a over time. In this way, dryout may be inhibited.

Note that according to the present exemplary embodiment, if the loop heat pipe 100 is horizontally disposed or if the loop heat pipe 100 is disposed in a bottom heat mode, a sufficient amount of the liquid phase working fluid remains in the liquid reservoir 5 of the evaporator 1 even when the loop heat pipe 100 stops operating. Thus, the working fluid is loaded into the pores of the wicks 4a and the wick 4b. Consequently, immediately after the temperature of the evaporator 1 reaches or exceeds the predetermined temperature, the main loop 10 starts operating in addition to the auxiliary loop 20.

Note that according to the present exemplary embodiment, as illustrated in FIG. 3, the blower fan 16 is disposed on the opposite side of the first condenser line 8a from the second condenser line 8b of the condenser 8. The reason for that is as follows.

That is, if the vapor phase working fluid in the auxiliary loop 20 is excessively cooled, the amount of the working fluid that is converted from a vapor phase to a liquid phase increases. Thus, the amount of vapor that pushes the liquid phase working fluid out into the liquid reservoir 5 decreases and, therefore, a rising speed of the liquid level in the liquid reservoir 5 decreases. In addition, after the loop heat pipe 100 normally starts operating, the main loop 10 mainly transfers heat. Accordingly, in order to increase the heat transfer efficiency, it is desirable that the first condenser line 8a be more intensively cooled than the second condenser line 8b.

For this reason, it is desirable that the blower fan 16 be disposed closer to the first condenser line 8a than to the second condenser line 8b, as illustrated in FIG. 3.

EXPERIMENT

A loop heat pipe having the above-described structure was actually produced, and the heat transfer resistance of the loop heat pipe was measured. The measurement values are described below together with those for a comparative example.

As the embodiment, a loop heat pipe having the structure illustrated in FIGS. 3 and 4, FIGS. 5A and 5B, and FIGS. 6A and 6B was produced.

The size of the evaporator 1 is 50 mm in width, 50 mm in length, and 10 mm in height. The heat transfer block 2 is made of oxygen free copper. The heat transfer block 2 has five through-holes formed therein. Each of the through-holes has a diameter of 8 mm. The through-holes are arranged parallel to one another. The wicks 4a and the wick 4b made of porous polytetrafluoroethylene (PTFE) were inserted and disposed in the through-holes.

Each of the wicks 4a and the wick 4b has a cylindrical shape having one closed end. The external diameter of each of the wicks 4a and the wick 4b is 8 mm. The inner diameter of each of the wicks 4a and the wick 4b is 4 mm. The length of each of the wicks 4a and the wick 4b is 30 mm. The outer peripheral surface of each of the wicks 4a and the wick 4b has a plurality of grooves each having a width of 1 mm and a depth of 1 mm. In addition, the average porous diameter of the wicks 4a and the wick 4b is about 10 µm, and the porosity is about 50%.

The heat transfer block 2 having the wicks 4a and the wick 4b disposed therein was attached to a metal casing. In this way, the evaporator 1 including the liquid reservoir 5 and the vapor collector 6 was formed. In order to reduce heat from directly transferring from the metal casing to the working fluid, a PTFE plate having a thickness of 1 mm and serving as a heat insulator was bonded to the inner surface of the liquid reservoir 5. The size of the liquid reservoir 5 is 6 mm in width, 46 mm in length, and 10 mm in height. The inner volume of the liquid reservoir 5 is about 3 cc. In addition, the partition wall 7 was provided in the vapor collector 6. Thus, the vapor collector 6 was partitioned into the first vapor collecting portion 6a and the second vapor collecting portion 6b.

A copper pipe having an external diameter of 6 mm and an inner diameter of 4 mm was used to produce the first vapor line 12, the first condenser line 8a, and the first liquid line 13 that formed the main loop 10. In addition, a copper pipe having an external diameter of 4 mm and an inner diameter of 3 mm was used to produce the second vapor line 22, the second condenser line 8b, and the first liquid line 13 that formed the auxiliary loop 20.

Thereafter, the evaporator 1 was brazed with the copper pipe. In addition, a fin was attached to the first condenser line 8a and the second condenser line 8b. In this way, the loop heat pipe according to the embodiment including the main loop 10 and the auxiliary loop 20 illustrated in FIG. 3 was achieved.

The length of the first vapor line 12 is 250 mm. The length of the first condenser line 8a is 150 mm. The length of the first liquid line 13 is 550 mm. In addition, the length of the second vapor line 22 is 200 mm. The length of the second condenser line 8b is 150 mm. The length of the second liquid line 23 is 500 mm. Furthermore, ethanol serving as working fluid was enclosed in the loop heat pipe.

In addition, as a comparative example, a loop heat pipe having the structure illustrated in FIG. 1 was produced. Like the embodiment, the size of the evaporator 61 is 50 mm in width, 50 mm in length, and 10 mm in height. Each of the vapor line 63, the condenser 62, and the fluid line 64 was made from a copper pipe.

Each of the loop heat pipes according to the embodiment and the comparative example was attached to a computer board (a circuit board) including a CPU. Note that thermal grease was applied to the CPU.

Thereafter, each of the computer boards according to the embodiment and the comparative example was vertically disposed so that the loop heat pipes are disposed in a top heat mode. Subsequently, a relationship between the heat generated by the CPU and the heat transfer resistance of the loop heat pipe was studied.

Figure 7:
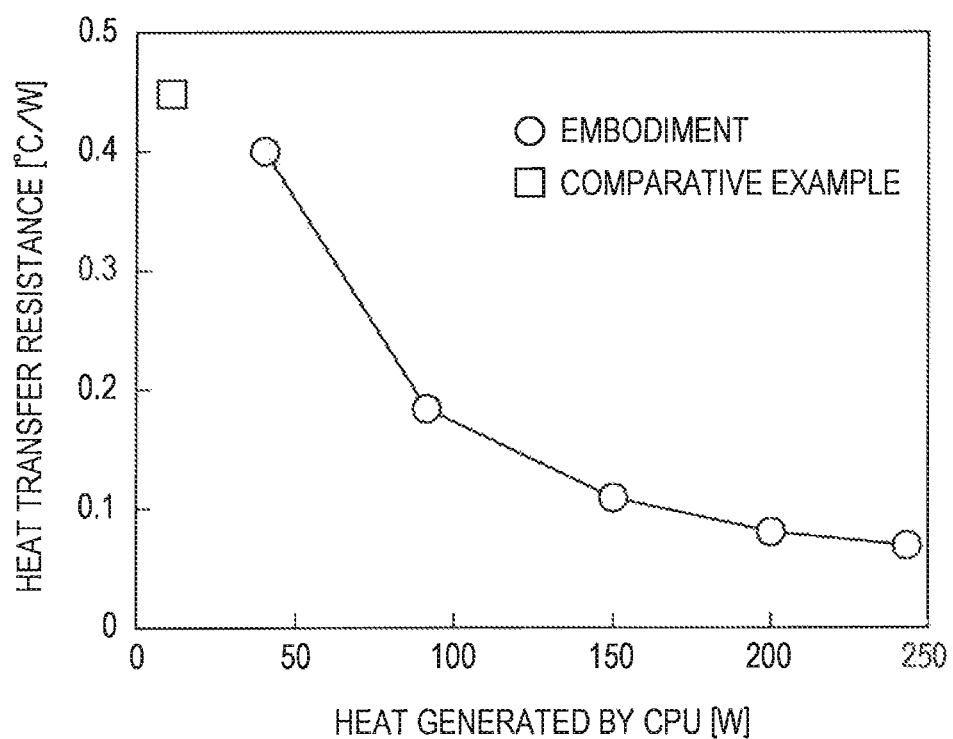
FIG. 7 illustrates a graph illustrating the result of a study of the heat transfer resistances of the loop heat pipe according to the exemplary embodiment and a loop heat pipe of a comparative example.

FIG. 7 is a graph illustrating the result of the study of the heat transfer resistances of the embodiment and the comparative example. In the graph, the abscissa represents the heat generated by the CPU and the ordinate represents the heat transfer resistances of the two loop heat pipes.

As illustrated in FIG. 7, in the loop heat pipe of the comparative example, when the heat generated by the CPU is 10 W, the heat transfer resistance exhibits a high value of 0.4° C/W. If the heat generated by the CPU is increased higher than 10 W, the temperature of the CPU rapidly rises. Therefore, it is difficult to measure the heat transfer resistance. The result indicates that dryout occurs in the loop heat pipe of the comparative example and, therefore, the working fluid is not circulated.

In contrast, in the loop heat pipe according to the embodiment, when the heat generated by the CPU is 50 W, the heat transfer resistance is 0.4° C./W. As the heat generated by the CPU increases, the heat transfer resistance decreases. In addition, dryout does not occur. The result indicates that the loop heat pipe according to the embodiment may reliably cool the CPU regardless of the heat generated by the CPU.

Electronic Apparatus

Figure 8:
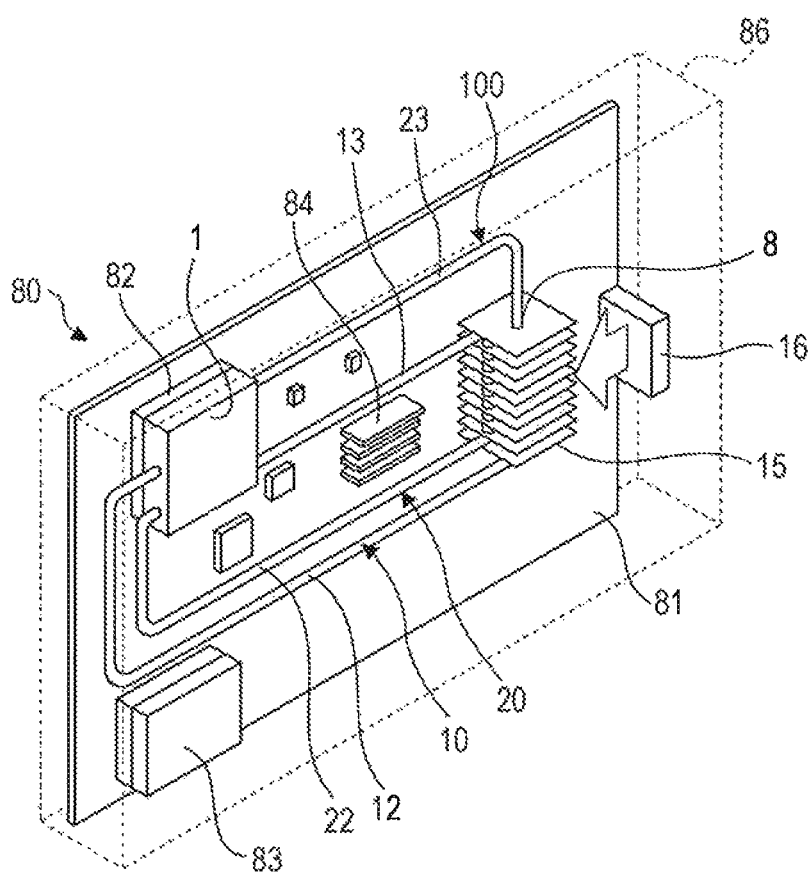
FIG. 8 is a perspective view of an electronic apparatus including the loop heat pipe according to the exemplary embodiment.

FIG. 8 is a perspective view of an electronic apparatus including the loop heat pipe according to the embodiment.

For example, an electronic apparatus 80 is a blade server or a tower personal computer. As illustrated in FIG. 8, a chassis 86 has a circuit board 81 having, for example, a CPU 82 and a memory 84 mounted thereon, a blower fan 16 that draws cooling air into the chassis 86, and a hard disk drive (storage unit) 83 disposed therein. The evaporator 1 of the loop heat pipe 100 according to the exemplary embodiment (refer to FIG. 3) is connected to the CPU 82. The condenser 8 of the loop heat pipe 100 is disposed in the vicinity of the blower fan 16. Cooling air is supplied from the blower fan 16 to the condenser 8. The first vapor line 12, the second vapor line 22, the first liquid line 13, and the second liquid line 23 are connected between the evaporator 1 and the condenser 8. In this way, the main loop 10 and the auxiliary loop 20 are formed.

According to the present exemplary embodiment, the electronic apparatus 80 has the loop heat pipe 100 disposed therein in a top heat mode in which the evaporator 1 is located above the condenser 8. As described above, the loop heat pipe 100 includes the main loop 10 and the auxiliary loop 20. If the temperature of the evaporator 1 reaches or exceeds a predetermined temperature, the loop heat pipe 100 reliably starts operating and sufficiently cools the CPU 82. In this way, a false operation or malfunction of the CPU 82 may be inhibited and, thus, the reliability of the electronic apparatus 80 may be increased.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A loop heat pipe, comprising:
   an evaporator to convert liquid phase working fluid into vapor phase working fluid;
   a condenser to convert vapor phase working fluid into liquid phase working fluid;
   a first vapor pipe and a first liquid pipe to allow the evaporator to communicate with the condenser and form a circular main loop; and
   a second vapor pipe and a second liquid pipe to allow the evaporator to communicate with the condenser and form a circular auxiliary loop,
   wherein the evaporator includes a reservoir that temporarily stores the liquid phase working fluid flowing from the first liquid pipe and the second liquid pipe, a first vapor collector that communicates with the first vapor pipe, a second vapor collector that is closer to the condenser than to the first vapor collector and that communicates with the second vapor pipe, a partition wall that separates the first vapor collector from the second vapor collector, a first wick formed from a porous member and disposed between the reservoir and the first vapor collector, and a second wick formed from a porous member and disposed between the reservoir and the second vapor collector.

2. The loop heat pipe according to claim 1,
   wherein the auxiliary loop is placed inside the main loop.

3. The loop heat pipe according to claim 1,
   wherein the evaporator has an appearance of a flat plate shape, and wherein the first wick and the second wick are arranged in a line in the evaporator.

4. The loop heat pipe according to claim 1,
   wherein the number of the first wicks is greater than the number of the second wicks.

5. The loop heat pipe according to claim 1,
   wherein the condenser has a heat dissipating fin attached thereto.

6. An electronic apparatus comprising:
   a circuit board having an electronic component mounted thereon; and
   a loop heat pipe, the loop heat pipe including
   an evaporator to convert liquid phase working fluid into vapor phase working fluid,
   a condenser to convert vapor phase working fluid into liquid phase working fluid,
   a first vapor pipe and a first liquid pipe to allow the evaporator to communicate with the condenser and form a circular main loop, and
   a second vapor pipe and a second liquid pipe to allow the evaporator to communicate with the condenser and form a circular auxiliary loop;
   wherein the evaporator includes a reservoir that temporarily stores the liquid phase working fluid flowing from the first liquid pipe and the second liquid pipe, a first vapor collector that communicates with the first vapor pipe, a second vapor collector that is closer to the condenser than to the first vapor collector and that communicates with the second vapor pipe, a partition wall that separates the first vapor collector from the second vapor collector, a first wick formed from a porous member and disposed between the reservoir and the first vapor collector, and a second wick formed from a porous member and disposed between the reservoir and the second vapor collector.

7. The electronic apparatus according to claim 6,
   wherein the evaporator is disposed above the condenser.

8. The electronic apparatus according to claim 6, further comprising:
   a blower fan to supply air to the condenser;
   wherein the blower fan is disposed closer to the main loop than to the auxiliary loop.

9. The electronic apparatus according to claim 6,
   wherein the auxiliary loop is placed inside the main loop.

10. The electronic apparatus according to claim 6,
    wherein the evaporator has an appearance of a flat plate shape, and wherein the first wick and the second wick are arranged in a line in the evaporator.

* * * * *